United States Patent [19]

Cave

[11] 4,053,915
[45] Oct. 11, 1977

[54] TEMPERATURE COMPENSATED CONSTANT CURRENT SOURCE DEVICE

[75] Inventor: David L. Cave, Tempe, Ariz.

[73] Assignee: Motorola, Inc., Schaumburg, Ill.

[21] Appl. No.: 669,065

[22] Filed: Mar. 22, 1976

[51] Int. Cl.² ............ H01L 29/80; H01L 29/78; H01L 27/02

[52] U.S. Cl. ............ 357/22; 357/23; 357/51; 357/86; 357/91

[58] Field of Search ............ 357/23, 22, 51, 86, 357/91

[56] References Cited

U.S. PATENT DOCUMENTS

| 3,590,342 | 6/1971 | Jekat | 357/23 |
| 3,623,217 | 11/1971 | Kawagoe | 357/23 |
| 3,787,717 | 1/1974 | Fischer et al. | 357/23 |

*Primary Examiner*—Edward J. Wojciechowicz
*Attorney, Agent, or Firm*—Michael D. Bingham

[57] ABSTRACT

There is disclosed a constant current source device comprising a diffused integrated circuit resistor in combination with a junction field effect transistor (FET). The FET is fabricated having an ion-implanted channel and diffused regions of the same conductivity type of material as the channel material, the diffused regions constitute the Source and Drain electrodes of the FET. The use of ion-implantation enables a tight tolerance to be maintained on the pinch-off voltage ($V_P$) characteristics of the FET. By extending the source diffusion region the diffused resistor is produced integral with the FET and has a constant and known, but high temperature coefficient (TC). By taking advantage of the high TC of the resistor and the controlled $V_P$ of the FET, the combining structure provides a constant current having a substantially zero temperature coefficient over the temperature range from −50° C to +125° C.

2 Claims, 11 Drawing Figures

TEMPERATURE COMPENSATED CONSTANT CURRENT SOURCE DEVICE

BACKGROUND OF THE INVENTION

This invention relates to constant current sources and more particularly to a constant current source circuit having a substantially zero temperature coefficient in the temperature range from −50° C to +125° C.

In many electrical circuits and systems there is a requirement for a current source which supplies a constant current that is relatively independent of the voltage applied thereto and is also relatively independent of the temperature of the operating environment. For instance, in a monolithic integrated operational amplifier circuit, a constant current source may be used for biasing the amplifier. As the bandwidth of the operational amplifier is a function of the bias current, it is very important that the biasing current be substantially constant over temperature variations. If the biasing current should vary with temperature, so will the bandwidth of the amplifier, which is undesirous.

One such prior art constant current source having temperature compensation is employed in the MC3503, "Quad Low Power Operational Amplifier", manufactured by Motorola, Inc., and illustrated in volume 6 of the "Semiconductor Data Library", pages 8-546 to 8-551. The constant current source comprises: a field effect transistor; a diode; three transistors; and a resistor. Although the temperature coefficient is very good, the number of components not only increase cost of the amplifier to the consumer, but also require a good portion of the chip die area to be fabricated therein. Thus, a need exist for a rather simple and less expensive device for providing a constant current source having a substantially zero temperature coefficient.

Furthermore, there is a prior art current regulator which comprises a junction field effect transistor having its source connected to its gate and which is connected between the base electrode and the emitter electrode of a bipolar transistor. The collector of the bipolar transistor serves as one of the electrodes of the current regulator. A resistor is connected between the emitter of the transistor and a second terminal of the current regulator. A zener diode is connected between the base of the transistor and the second terminal of the current regulator. The current regulator of the prior art provides a current which is relatively independent of the voltage applied across its terminals, but which vary substantially with the ambient temperature. In particular, the current therein depends heavily on the temperature variations of the emitter resistor, the base to emitter forward bias voltage of the bipolar transistor, and the voltage across the zener diode.

The present invention solves the shortcomings of the above prior art devices by providing a temperature compensated constant current source of simple construction and which has a temperature coefficient which is substantially zero.

SUMMARY OF THE INVENTION

Accordingly, it is an object of the invention to provide an improved current source.

Another object of the present invention is to provide an imroved constant current source having a substantially zero temperature coefficient over a predetermined temperature range.

A further object of the present invention is to provide a current source suitable for producing a sustantially constant current which is independent of the operating voltage and temperature environment.

In accordance with the aforementioned objects, the present invention is a constant current source device suitable for providing a constant current, the magnitude of which is substantially independent of the voltage applied to the device and operating temperature environment. The constant current source device comprises a junction field effect transistor having an ion implanted channel and gate region and a linearly diffused resistor formed integral with the Source diffused region thereof. By utilizing ion-implantation, the pinch-off voltage characteristics of the field effect transistor are tightly controlled such that the overall temperature coefficient of the resulting structure comprising the field effect transistor and the diffused resistor has a substantially zero temperature coefficient. Thus, the current produced at the output of the device, in response to a voltage being applied thereto, is essentially constant and independent of the applied voltage as well as the temperature environment which may vary from −50° C to +125° C.

DETAILED DESCRIPTION OF THE PREFERRED EMBODIMENT

The method of integrated circuit fabrication of the present invention will now be described in terms of the fabrication steps used to manufacture the preferred embodiment in accordance with FIGS. 1-8 which show the structure of the integrated circuit device being fabricated at various stages in the process. To simplify the discussion, the conventional process steps will be described only briefly.

Figure 1:
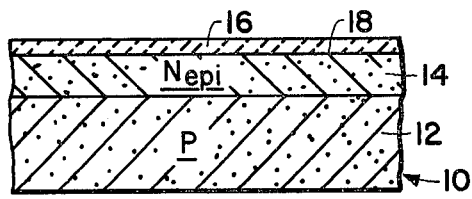
FIGS. 1-8 show cross-sectional views of a semiconductor substrate at various stages of the manufacturing process of the present invention.

FIG. 1 illustrates the cross-section of a segment of wafer 10, P-type substrate 12 may be the substrate material of wafer 10. N-type epitaxial layer 14 is deposited onto substrate 12 in a conventional manner. However, it is to be understood that wafer 10 may or may not be an epitaxial wafer but could also be an N type wafer wherein N epitaxial layer 14 is the substrate of the wafer. The thickness of N epi layer 14 may be on the order of 11-14 microns and its resistivity may be between 2-3 ohm centimeters.

Figure 2:
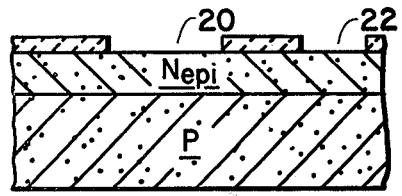

Next, a thin layer 16 of silicon dioxide is deposited or grown on top surface 18 of N epi layer 14. As illustrated in FIG. 2, using conventional photoresist and eching techniques, a mask is formed in a single step for defining a predetermined pattern of openings 20 and 22 into silicon dioxide layer 16 which are utilized for forming the conventional base or Source and Drain diffusion regions.

Figure 3:
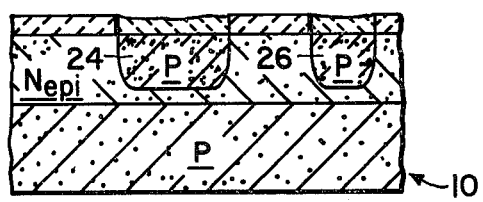

In the step of FIG. 3, the Source and Drain regions are then formed, as for example, by diffusion, into N epi layer 14. The Source and Drain regions 24 and 26 are of a P-type dopant material and extend vertically into N epi layer 14 an approximate depth of 2.5 microns. The resistivity of the P type material is on the order of 200 ohms per square. During the diffusion process silicon oxide is then formed on the exposed surface 18 thereby closing openings 20 and 22.

Figure 4:
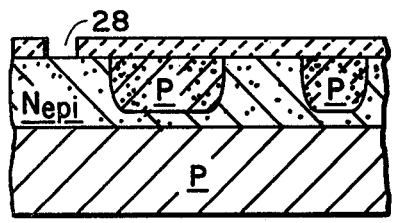
Figure 5:
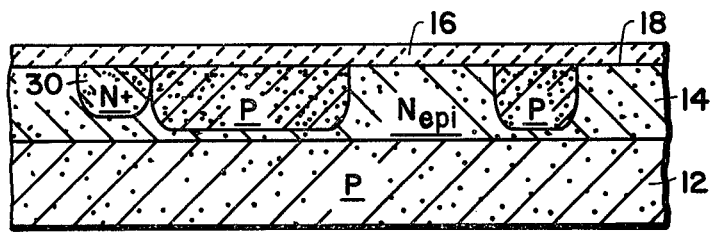

As illustrated in FIGS. 4 and 5, in a conventional manner, mask opening 28 is formed through silicon oxide layer 16 and N-type region 30 is diffused into N epi layer 14. N diffusion region 30 is approximately 2 microns in depth and is formed of an N-type material having a resistivity of approximately 7 ohms per square. Region 30 is formed adjacent to region 24.

Figure 6:
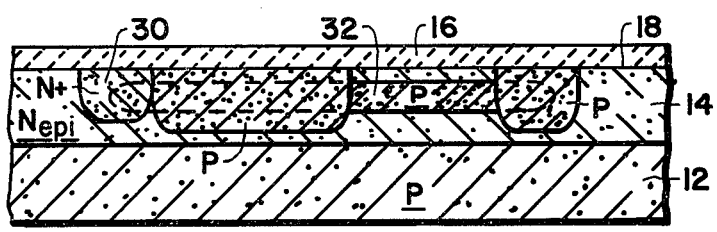

As illustrated in FIG. 6, although not shown, utilizing known photoresist and photoetching techniques, a masked opening is produced in silicon dioxide layer 16 and a thin region 32 of P-type material if formed in N epitaxial layer 14. This thin region is formed by ion implantation, a known techinque. Thus, a P channel is formed between the Source and Drain regions of the field effect transistor (FET). In a preferred form, the thin layer or region 32 is caused to have a concentration peak at approximately 0.3 microns within the N epi layer 14. The concentration gradient of region 32 is of a double Gausian curve type. Although P-type impurities are implanted in the N-type region 30, the net doping of this region remains N-type because of a higher concentration of N-type impurities from the emitter diffusion step which produced the region.

Moreover, it can be seen that, in the preferred embodiment, the area of Source region 24 is substantially greater than Drain region 26. As is understood in the art, the greater area of Source region 24 produces a diffused resistor structure fabricated using a P-type material. The effective value of the resistance is a function of the total length and width of the diffused region, as is understood. Thus, a linear diffused resistor having a known temperature coefficient, which is a function of the resistivity of the P-type material, is formed integrally with Source region 24 of FET 10.

Figure 7:
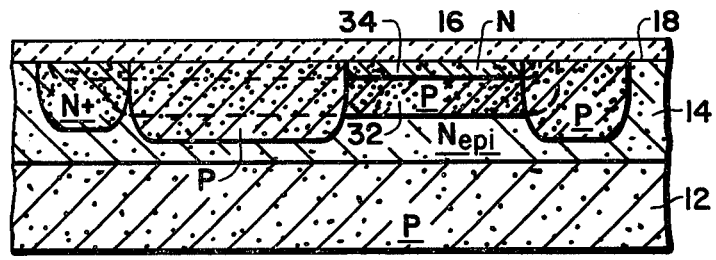

As shown in step 7, an additional region 34 is formed between the surface of N epitaxial layer 14 and the upper surface of region 32. Region 34 is also formed into N epi layer 14 by using ion implantation. Due to the high energy required for ion-implantation, the implantation of regions 32 and 34 can take place through the silicon dioxide layer 16 as is understood. Although P-type impurities are implanted in the N+ region 30 during the forming of region 32, the net doping of this region remains N-type because of the higher concentration of N-type impurities from the diffusion process. Therefore, the P implant region does not compensate the N diffusion region 30. Ion-implanted region 34, which is the gate of the FET, is thus shorted to N epi layer 14 through N+ diffusion region 34 such that a conventional junction FET structure is formed. As illustrated in FIG. 7, the FET structure includes region 34 as the first Gate of the FET which by being shorted through diffusion region 34 establishes a second Gate of the FET which is essentially N epi layer 14. The ion-implanted P-type region 32 provides the channel between the Source and Drain regions 24 and 26 respectively. Therefore, the resultant structure is a FET having a linear diffused type resistor made of the P-type diffusion region 24 in series with the Source of the FET.

Figure 8:
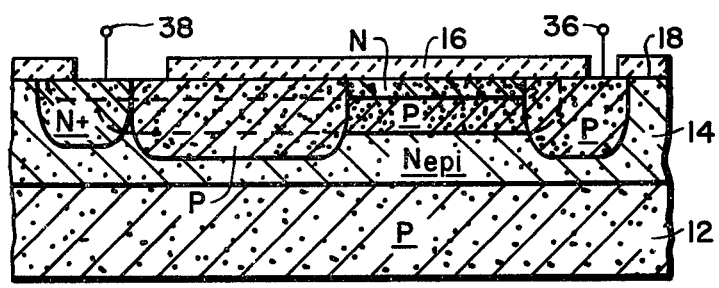

In the structure illustrated in FIG. 8, the completed FET structure is shown wherein openings are formed in silicon dioxide layer 16 to form the metallic contacts for the two terminals of the constant current source device. Symbolically shown, metallic contact 36 would be the output terminal of the constant current source device and metallic contact terminal 38 would be the input terminal to which a voltage would be applied thereto. Conventional process steps for making the metal masking and metal etching as well as the final passivation if needed to protect the surface are employed to complete the device.

Figure 9:
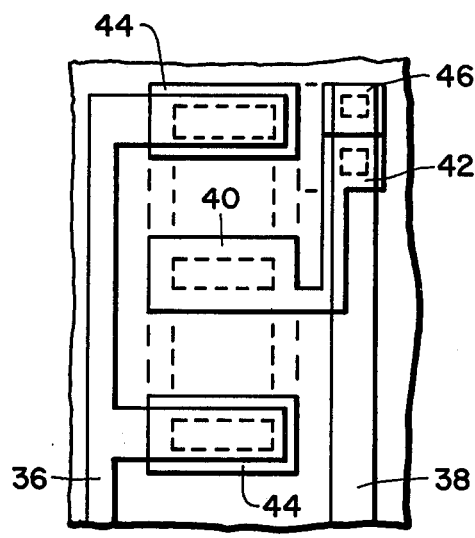
FIG. 9 is a top plan view illustrating the particular metallized regions of the structure of the present invention.

Referring to FIG. 9, there is illustrated by a plan view, the semiconductor device illustrated by FIG. 8 showing the metal patterns. The same reference numerals are used in FIG. 9 for components corresponding to the components of FIG. 8. Region 40 is illustrated as being elongated to include Source region 24 and with element 42 which is the diffused resistor to which metal contact 38 is made. Similarly, portions 44 relate to Drain region 26 of the semiconductor device and are attached to metal contact member 36 which maybe the output terminal of the device. Region 46 corresponds to Gate region 34, and N region 30 and is also attached to metal contact member 38.

Figure 10:
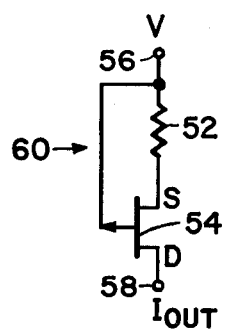
FIG. 10 shows the resultant structure, in schematic form of the present invention.

The completed structure of the constant current source device comprising the linear diffused resistor and junction FET, can be schematically shown by FIG. 10. Resistor 52 corresponds to the linear diffused resistor which is integral to the Source terminal of the FET 54.

The operation of constant current source device 50 is described. Terminal 56 which corresponds to metal contact member 38 is adapted to be connected to a source of operating potential. In resonce to the applied potential, a current, $I_{OUT}$, having an essentially constant magnitude is produced at output terminal 58.

By using standard feedback equations, the current, $I_{OUT}$ of FIG. 10 can be shown to be equal to:

$$I_{OUT} \approx \frac{I_{dss}}{1 + I_{dss}\frac{2R}{V_p}} \tag{1}$$

where:
R = the magnitude of R52
$V_p$ = pinch-off voltage of FET 54
$I_{dss}$ = saturation current of FET 54.

$I_{OUT}$ can be made to have an essentially zero temperature coefficient if the derivative thereof with respect to temperature, should be equal to zero. Thus, it can be shown by taking the derivative of equation (1) and equating it to zero, that:

$$\frac{dI_{OUT}}{dT} = 0 = -\frac{1}{2}\frac{(V_p R - R V_p)}{R^2} \tag{2}$$

and therefore $$\overset{\circ}{V_p} = \frac{V_p \overset{\circ}{R}}{R} \tag{3}$$

where
$\overset{\circ}{R}/R$ = the T.C. of diffused resistor, R52; and $\overset{\circ}{V_p}$ = the T.C. of a silicon semiconductor device.

The diffused, resistive portion, which is integral to the Source of the FET, is of 200 ohms per square P-type material which, as is known in the industry, has a temperature coefficient of approximately $2 \times 10^{-3}$ p/° C. Moreover, the temperature coefficient for a semiconductor device formed of silicon materials is approximately $2.2 \times 10^{-3}$ V/° C. Substituting the above values of temperature coefficients into equation (3) requires that a pinch-off voltage ($V_P$) of 1.1 volts be established in the FET. As previously stated, because of ion-implantation, the FET of the current device of FIG. 10 can be made to have a controlled $V_P$ of 1.1 volts. Thus, the current produced in response to an applied voltage, at the output of current device 60 will be relatively independent to temperature variations.

The magnitude of current established at output terminal 58 of source 60 can be varied by varying the magnitude of the linear diffused resistor and has no effect on the temperature coefficient thereof. As long as this current is designed to be less than the $I_{dss}$ of the FET device, the current out of the constant current source device will be constant and have a substantially zero temperature coefficient over a predetermined range of temperatures.

Figure 11:
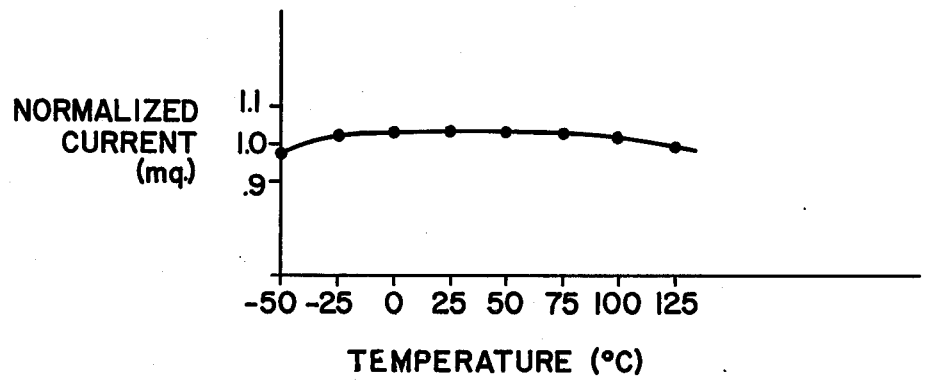
FIG. 11 shows a graph illustrating the temperature characteristics of the constant current source device of the present invention.

Therefore, by taking advantage of the high temperature coefficient of the P-type diffused resistor and by tightly controlling the pinch-off voltage characteristics of the FET by utilizing ion implanting of the P channel thereof, a two terminal constant current source device has been provided. Using the above described structure, a zero temperature coefficient current source device has been fabricated in which the output current varies less than 3% over a temperature range of $-50°$ C to $+125°$ C, as illustrated by FIG. 11. In the past, a discrete FET and resistor may have produced a current source having a TC as bad as 30% over the same temperature excursion. Thus, there has been discussed and shown, a current source device having a temperature coefficient which is better than the prior art by several magnitudes.

In summary, a temperature compensated constant current source device has been disclosed which has a typical temperature coefficient of less than 3% over the temperature range of $-50°$ C to $+125°$ C.

The current source device comprises a field effect transistor (FET) and a resistor. During the process step wherein the Source and Drain electrodes of the FET are formed, the resistor is also formed by essentially lengthening and/or widening the Source region thereby forming a semiconductor resistor in series therewith. By controlling the resistivity of the material used for forming the combination of the Source electrode and resistor, the temperature coefficient of the resistor is known. The temperature coefficient of the FET is known as is understood. As the pinch-off characteristics of the FET is a function of the aforementioned temperature coefficients, a design equation has been derived to determine the required pinch-off voltage to thereby temperature compensate the current produced through the combined structure.

The process for fabricating the current source device is compatible with normal monolithic integrated circuit fabrication techniques. Thus, the disclosed constant current source device is suitable to be provided on chip with, for example, a monolithic integrated operational amplifier for biasing the same. The constant current source device of the invention is also suitable to be used in many other applications requiring a temperature independent current regulator.

What is claimed is:

1. A temperature compensated semiconductor current source device having a first terminal which is adapted to be connected to an operating bias potential for producing a current at an output terminal thereof of which the magnitude is substantially independent to variations of in combination:

a junction field effect transistor having a predetermined, controlled pinch-off voltage characteristic and having;

a. an epitaxial layer of semiconductor material of a first conductivity type;

b. a drain electrode comprising a semiconductor material of a second conductivity type, said drain electrode being diffused into said epitaxial layer;

c. a source electrode comprising said semiconductor material of said second conductivity type having a predetermined value of resistivity being diffused into said epitaxial layer;

d. a source to drain channel region of said second conductivity type being formed into said epitaxial layer between said source and drain electrodes, said channel region being ion-implanted;

e. a first region of a semiconductor material having a higher concentricity of said first type, said first region being diffused into said epitaxial layer adjacent to said source electrode; and f. a second region of said first conductivity type formed into said epitaxial layer which extends into said first region and having a bottom surface contiguous along the upper surface of said source to drain ion-implanted channel;

g. first metal conductor means for connecting said first region to the first terminal of the device;

h. second metal conductor means for connecting said drain electrode to the output terminal;

said source electrode being extended in its physical area such that a linear diffused resistor is formed integrally therewith having a predetermined temperature coefficient that is a function of the resistivity of said semiconductor material comprising said source electrode; and said diffused resistor and said field effect transistor having respective temperature coefficients which compensate each other so that the magnitude of the current produced at the output terminal of the current source device is substantially independent to temperature variations.

2. A semiconductor current device having first and second terminals for providing a predetermined current at the second terminal the magnitude of which is substantially independent of both operating potential and temperature variations, comprising: a junction field effect transistor having a predetermined, controlled voltage pinch-off characteristic and which includes diffused source and drain regions of a first semiconductor type of material and a gate region of a second semiconductor type of material, said gate region being connected to the first terminal, said drain region being connected to the second terminal, said diffused source region having a predetermined cross-sectional area such that a diffused semiconductor resistor is formed integrally therewith which is connected between said source and gate electrode having a predetermined temperature coefficient, said junction field effect transistor having a predetermined temperature coefficient being controlled by said voltage pinch-off characteristic wherein said temperature coefficients of said junction field effect transistor and said semiconductor resistor are self-compensating such that the current produced through said junction field effect transistor is independent to temperature variations.

* * * * *